United States Patent
Hirabayashi et al.

(10) Patent No.: US 7,455,531 B2
(45) Date of Patent: Nov. 25, 2008

(54) FLEXIBLE BOARD, ELECTROOPTIC DEVICE HAVING A FLEXIBLE BOARD, AND ELECTRONIC DEVICE

(75) Inventors: Hidekazu Hirabayashi, Shiojiri (JP); Tomoaki Miyashita, Shimosuwa-machi (JP)

(73) Assignee: Seiko Epson Corportion, Tokyo (JP)

( * ) Notice: Subject to any disclaimer, the term of this patent is extended or adjusted under 35 U.S.C. 154(b) by 0 days.

(21) Appl. No.: 11/904,924

(22) Filed: Sep. 28, 2007

(65) Prior Publication Data
US 2008/0084530 A1    Apr. 10, 2008

(30) Foreign Application Priority Data
Oct. 4, 2006    (JP)    ............... 2006-272647

(51) Int. Cl.
  *H01R 12/00*    (2006.01)
(52) U.S. Cl. .................. 439/67; 439/951; 174/154
(58) Field of Classification Search .......... 439/67, 439/62, 60, 951; 174/254
  See application file for complete search history.

(56) References Cited

U.S. PATENT DOCUMENTS

| | | | | |
|---|---|---|---|---|
| 5,274,195 A * | 12/1993 | Murphy et al. | ......... | 174/117 FF |
| 5,590,465 A * | 1/1997 | Santo | ................. | 29/884 |
| 5,865,631 A * | 2/1999 | Berto et al. | ............. | 439/59 |
| 6,234,807 B1 * | 5/2001 | Amini et al. | ............ | 439/60 |
| 6,464,537 B1 * | 10/2002 | Letourneau et al. | ......... | 439/608 |
| 6,585,921 B2 | 7/2003 | Kohli | | |
| 6,994,563 B2 * | 2/2006 | Amini et al. | ............ | 439/62 |
| 7,301,104 B2 * | 11/2007 | Miura et al. | ............ | 174/254 |
| 7,338,290 B2 * | 3/2008 | Motohashi et al. | ........... | 439/60 |
| 7,374,430 B2 * | 5/2008 | Nagawatari | ............. | 439/67 |
| 2005/0202693 A1 * | 9/2005 | Kuo et al. | ............... | 439/67 |

FOREIGN PATENT DOCUMENTS

| | | |
|---|---|---|
| JP | 60-181067 | 12/1985 |
| JP | 63-69294 | 3/1988 |
| JP | 06-204636 | 7/1994 |
| JP | 7-296941 A | 11/1995 |
| JP | 2001-332820 | 11/2001 |
| JP | 2002-333640 | 11/2002 |
| JP | 2003-347699 | 12/2003 |
| JP | 2004-207650 | 7/2004 |

* cited by examiner

*Primary Examiner*—Ross N Gushi
(74) *Attorney, Agent, or Firm*—AdvantEdge Law Group, LLC (57) ABSTRACT

The disclosure is directed to flexible boards, electrooptic devices having flexible boards, and electronic devices. In one example, wires are disposed longitudinally along the length of a flexible board. Terminals are arranged laterally across the width of the flexible board near an end of the flexible board, the terminals being electrically connected to the wires. Plating lead wires are electrically connected to the terminals and extend longitudinally from the terminals to a lateral edge of the flexible board. The width of the plating lead wires is less than the width of the wires. In certain embodiments, at least a portion of the terminals are alternatingly displaced on the flexible board in a staggered manner. This abstract is intended only to aid those searching patents, and is not intended to be used to interpret or limit the scope or meaning of the claims in any manner.

16 Claims, 8 Drawing Sheets

FLEXIBLE BOARD, ELECTROOPTIC DEVICE HAVING A FLEXIBLE BOARD, AND ELECTRONIC DEVICE

RELATED APPLICATION INFORMATION

The present application claims priority from Japanese Patent Application No. 2006-272647, filed on Oct. 4, 2006, the disclosure of which is hereby incorporated by reference in its entirety.

BACKGROUND

This disclosure relates to a flexible board that may be mounted to an electrooptic device such as a liquid crystal device, and an electronic device such as, for example, a liquid crystal projector, that includes such electrooptic device.

Various electronic devices such as projectors, portable phones, and mobile personal computers incorporate electrooptic devices such as liquid crystal devices.

Electrooptic devices and electronic devices are commonly connected in such a manner that a connector extending from the electrooptic device is connected to a flexible board, and the flexible board is connected to the connecting portion of the electronic device. The connector and the flexible board are commonly connected by inserting the end of the flexible board having the terminals of the wires into the connector. For example, Japanese Patent Application Laid-Open Publication No. 7-296941 proposes an insertion jig with which the operator can insert the end of the flexible board into the connector.

The flexible board may have plating lead wires for electroplating the terminals of the wires with gold for each terminal.

However, this method is problematic as the possibility exists of a short circuit between adjacent terminals by the plating lead wires if the end of the flexible board is inserted at an angle into the connector. This short circuit between the adjacent terminals may cause abnormal operation or problems with the device connected to the flexible board.

SUMMARY

In certain embodiments, a flexible board for making electrical connection to a connector has a plurality of wires disposed longitudinally along the length of the flexible board. A plurality of terminals are arranged laterally across the width of the flexible board near an end of the flexible board. The plurality of terminals are electrically connected to the wires. A plurality of plating lead wires are electrically connected to the terminals and extend longitudinally from the terminals to a lateral edge of the flexible board. The plating lead wires have a width that is less than the width of the wires.

The flexible board may be connected to the connector in such a manner that an end of the flexible board is fitted in the connection opening of the connector. In other words, the end of the flexible board is inserted into the connection opening of the connector so that the plurality of connection terminals in the connector are brought into contact with the plurality of terminals on the flexible board, electrically connecting the connector and the flexible board. The terminals may be arranged in a line or in a staggered manner along the width of the flexible board at one end of the flexible board. The connection terminals of the connector may also be arranged in a line or staggered manner in the opening of the connector. The flexible board is electrically connected to an electronic device such as a projector via the connector. The other end of the flexible board opposite of the connector is connected to an electrooptic device such as a liquid crystal device.

The flexible board may have a plurality of plating lead wires on the main body. The plurality of plating lead wires are used to apply a predetermined potential for plating the plurality of terminals with gold, gold plating, or the like to the plurality of terminals during the manufacture of the flexible board. The plating lead wires are generally not used during the operation of the device to which the flexible board is mounted. The plating lead wires may be connected to the portions of the terminals different from the portions connected to the wires, such as the portions opposite of the wires, and may extend along the length to an edge of the flexible board (for example, an edge adjacent to the end, that is, an edge along the width at the end).

In certain embodiments, the width of each plating lead wire is set smaller than the width of each wire. This can help reduce or prevent the short circuit (electrical shorting) between adjacent terminals that may otherwise occur when the flexible board is inserted at an angle into the connector. For example, if the plating lead wires and the wires are formed in such a manner that the width of each plating lead wire and the width of each wire are equal, without taking any additional measures, when the flexible board is inserted at an angle into the connector, a first plating lead wire and a second terminal adjacent to a first terminal connected to the first plating lead wire could potentially be short circuited by the connection terminal of the connector. The reason being that the connection terminal of the connector may come into contact with both the first plating lead wire and the second terminal, the first plating lead wire and the second terminal (i.e., the first terminal and the adjacent second terminal, in other words, the adjacent terminals) being electrically shorted. If a device connected to the flexible board is activated with the adjacent terminals short-circuited, an excessive current may flow into the device and interfere with normal operation or cause failure due to heat.

However, as described above, in certain embodiments the width of each plating lead wire is set smaller than the width of each wire. Accordingly, the distance between the first plating lead wire and the second terminal adjacent to the first terminal electrically connected to the first plating lead wires, or the distance between adjacent plating lead wires may be larger in comparison to when the width of each plating lead wire and the width of each wire are equal. This can be effective in helping prevent the contact of the connection terminal of the connector with both the first plating lead wire and the second terminal, or helping reduce or prevent the occurrence of a short circuit between adjacent terminals. This may also help reduce or prevent an abnormal operation or failure of a device connected to the flexible board due to a short circuit between the adjacent terminals.

The use of the flexible board according to certain embodiments may help reduce or prevent the occurrence of a short circuit between adjacent terminals because the width of each plating lead wire may be smaller than the width of each wire.

In certain embodiments, at least part of the plurality of terminals of the flexible board is arranged in a staggered manner.

For example, at least part of the terminals may be arranged in a staggered manner (alternately displaced in the longitudinal direction) along the width. This may help reduce the distance between adjacent terminals of the plurality of terminals, or may help the terminals be arranged with a narrow pitch as compared with a when the terminals are arranged in a line along the width. This can help the terminals (and the wires) be arranged in a highly dense manner on the flexible board, or help reduce the size of the flexible board. Furthermore, since the width of each plating lead wire may be set smaller than that of each wire, the occurrence of the short circuit between adjacent terminals can be reduced or prevented. Thus, the array pitch of the terminals may be decreased while helping reduce or prevent the occurrence of a short circuit between adjacent terminals.

In certain embodiments, end plating lead wires connected to the terminals at the ends of the array of the plurality of terminals extend along the width.

For example, the end plating lead wires extend from the terminals at the ends of the array of the terminals to the side edges of the flexible board along the width intersecting the longitudinal direction in which the other plating lead wires extend. Thus, in these embodiments, no plating lead wire is provided at the ends of the terminals disposed at the ends of the array of the terminals. This can help reduce or prevent the occurrence of a short circuit between the terminals at the ends of the array of the terminals and the adjacent terminals.

In certain embodiments, power-source-side terminals adjacent to power-source terminals to which supply potential is applied may be configured as dummy terminals in which no electric signal is input or output.

For example, the power-source-side terminals adjacent to the power-source terminals may be dummy terminals. Thus, even if the flexible board is inserted at an angle into the connector such as to generate a short circuit between the power-source terminals and the power-source-side terminals, potentially little or no negative influence, such as excess current or heat generation, is exerted on a device connected to the flexible board.

Generally, the power-source terminals are higher in potential than the other terminals to which other signals (for example, an image signal and various control signals) different from the supply potential are applied. Therefore, if the power-source terminals and the other terminals are short-circuited, trouble may occur in a device connected to the flexible board. Accordingly, in accordance with certain embodiments, the structure in which the power-source-side terminals adjacent to the power-source terminals are formed as dummy terminals can help reduce or prevent the occurrence of a short circuit between the power-source terminals and the other terminals to which other signals different from supply potential are applied, and thereby helping reduce or prevent trouble to the device connected to the flexible board.

The difference between the power-source-side terminals serving as dummy terminals and the other terminals is that no electric signal is input or output. Since no electric signal is applied to the power-source-side terminals serving as dummy terminals (although the structure is similar to the other terminals), they may not be connected to wires or plating lead wires.

In embodiments where the power-source-side terminals are configured as dummy terminals, as described above, the power-source-side terminals may not be connected to the plating lead wires.

Since the power-source-side terminals serve as dummy terminals in which no electric signals are input to or output from, they need not be plated. Therefore, no plating lead wires are provided to the power-source-side terminals. This helps reduce or prevent the occurrence of a short circuit between the power-source terminals and the power-source-side terminals.

According to certain embodiments, an electrooptic device includes a flexible board as described above.

Since the electrooptic device includes the above-described flexible board, the occurrence of a short circuit between adjacent terminals on the flexible board may be reduced or prevented. Therefore, an electrooptic device with higher reliability may be achieved.

According to certain embodiments, there is provided an electronic device including the electrooptic device as described above.

Since the electronic device has the above-described electrooptic device, the occurrence of a short circuit between adjacent terminals on the flexible board may be reduced or prevented. Therefore, various electronic devices may be achieved with higher reliability. Exemplary electronic devices include projection display devices, televisions, portable phones, electronic notebooks, word processors, viewfinder or monitor-direct-view type videotape recorders, workstations, TV phones, POS terminals, and touch panels. Other examples of electronic devices include electrophoresis devices such as electronic paper, field-emission displays and conduction electron-emitter displays, and display devices using such electrophoresis devices, field-emission displays and conduction electron-emitter displays.

Additional details and exemplary embodiments are disclosed below.

BRIEF DESCRIPTION OF THE DRAWINGS

Various embodiments are described with reference to the accompanying drawings, wherein like reference numbers designate like elements, and in which.

DESCRIPTION OF EXEMPLARY EMBODIMENTS

Embodiments described herein will be best understood by reference to the drawings. It will be readily understood that the components generally described and illustrated in the drawings herein could be arranged and designed in a variety of configurations. Thus, the following description, as represented in the drawings, is not intended to limit the scope of the disclosure but is merely representative of certain embodiments.

A flexible board 200 according to certain embodiments will be described with reference to FIGS. 1-4.

Figure 1:
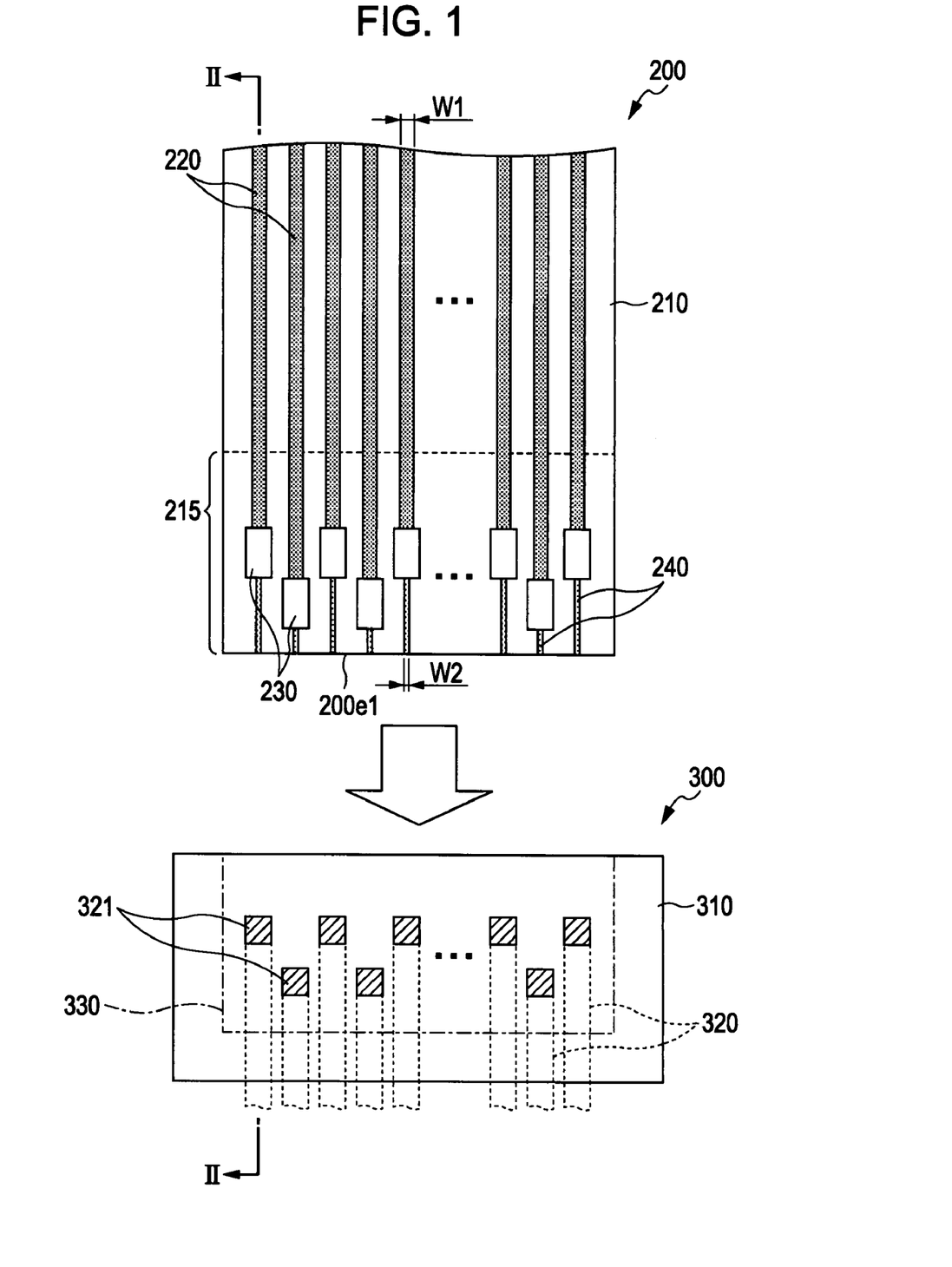
FIG. 1 illustrates a plan view of an exemplary flexible board and a connector.
Figure 2:
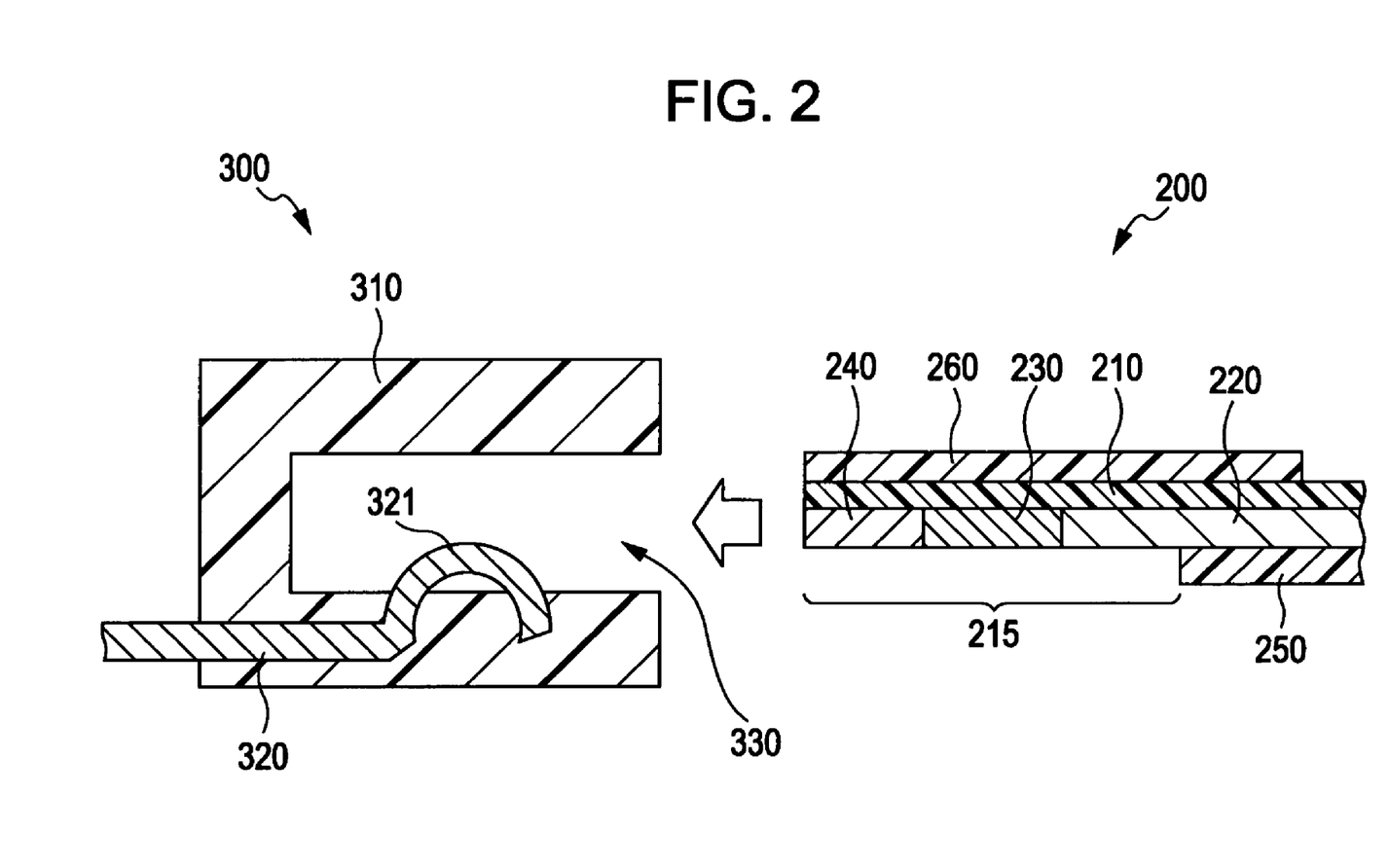
FIG. 2 illustrates a cross sectional view of FIG. 1, taken along line II-II'.

Referring first to FIGS. 1 and 2, the configuration of the flexible board 200 will be described along with the configuration of a connector 300 connected to the flexible board. FIG. 1 is a plan view of the entire configuration of the flexible board 200 and the connector 300. FIG. 2 is a cross sectional view of FIG. 1, taken along line II-II'. FIG. 1 shows the flexible board 200 and the connector 300 in perspective, but does not show a cover 250 and a reinforcing plate 260 (see FIG. 2).

In FIGS. 1 and 2, the flexible board 200 includes a main body 210, a plurality of wires 220, a plurality of terminals 230, a plurality of plating lead wires 240, the cover 250 (see FIG. 2), and the reinforcing plate 260 (see FIG. 2).

The main body 210 can be folded when mounting, and is made of resin film, plastic film or the like.

The wires 220 are placed on one surface of the main body 210, and are made of electrically conductive and low-resistance metal film that can be folded with the main body 210 thereon. The plurality of wires 220 is provided in correspondence with the plurality of terminals 230 for connection with the connector 300, and extends along the length of the flexible board 200 (vertically in FIG. 1).

The terminals 230 are made of conductive metal. The terminals 230 are provided at one end of the flexible board 200 and connected to the wires 220, respectively. The terminals 230 may be arranged in a staggered manner along the width of the flexible board 200. For example, the terminals 230 may be arranged such that at least a portion of the adjacent terminals are alternatingly displaced along the length of the flexible board 200 (displaced vertically in FIG. 1). The staggered arrangement of the terminals 230 can reduce the pitch between adjacent terminals 230 and thereby save space and reduce the size of the flexible board 200. The contacts 321 of connection terminals 320 of the connector 300 are also arranged in a staggered manner at the opening 330 of the connector 300.

The plating lead wires 240 may be connected to the ends of the terminals 230 opposite of the wires 220 (bottom portion of FIG. 1) and extend to a lateral edge 200e1 of the flexible board 200 (extending vertically in FIG. 1). The plating lead wires 240 may be made of either the same material as that of the wires 220 and the terminals 230 or of another conductive metal.

The cover 250 is foldable, and may be made of resin film or resist. The cover 250 covers the wires 220 except for the exposed portions of the wires 220, such as the terminals 230 that come in contact with the contacts 321.

The reinforcing plate 260 is made of resin or the like, and is bonded onto the surface of the main body 210 opposite to the wires 220, at the end of the flexible board 200 next to the connector 300.

The connector 300 includes a connector casing 310 made of a material such as resin or the like and the connection terminals 320 may be made of metal such as copper or aluminum. The flexible board 200 may be connected to the connector 300 by fitting an end 215 of the flexible board 200 with the connection opening 330 of the connector casing 310. For example, the end 215 of the flexible board 200 may be inserted into the connection opening 330 of the connector casing 310 so that the contacts 321 of the connection terminals 320 of the connector 300 make electrical contact with the terminals 230, and thus connecting together the connector 300 and the flexible board 200.

The thickness of the end of the reinforcing plate 260 is adjusted to a thickness that allows connection with the connector 300 and allows the end 215 of the flexible board 200 to engage with the connector 300.

Figure 3:
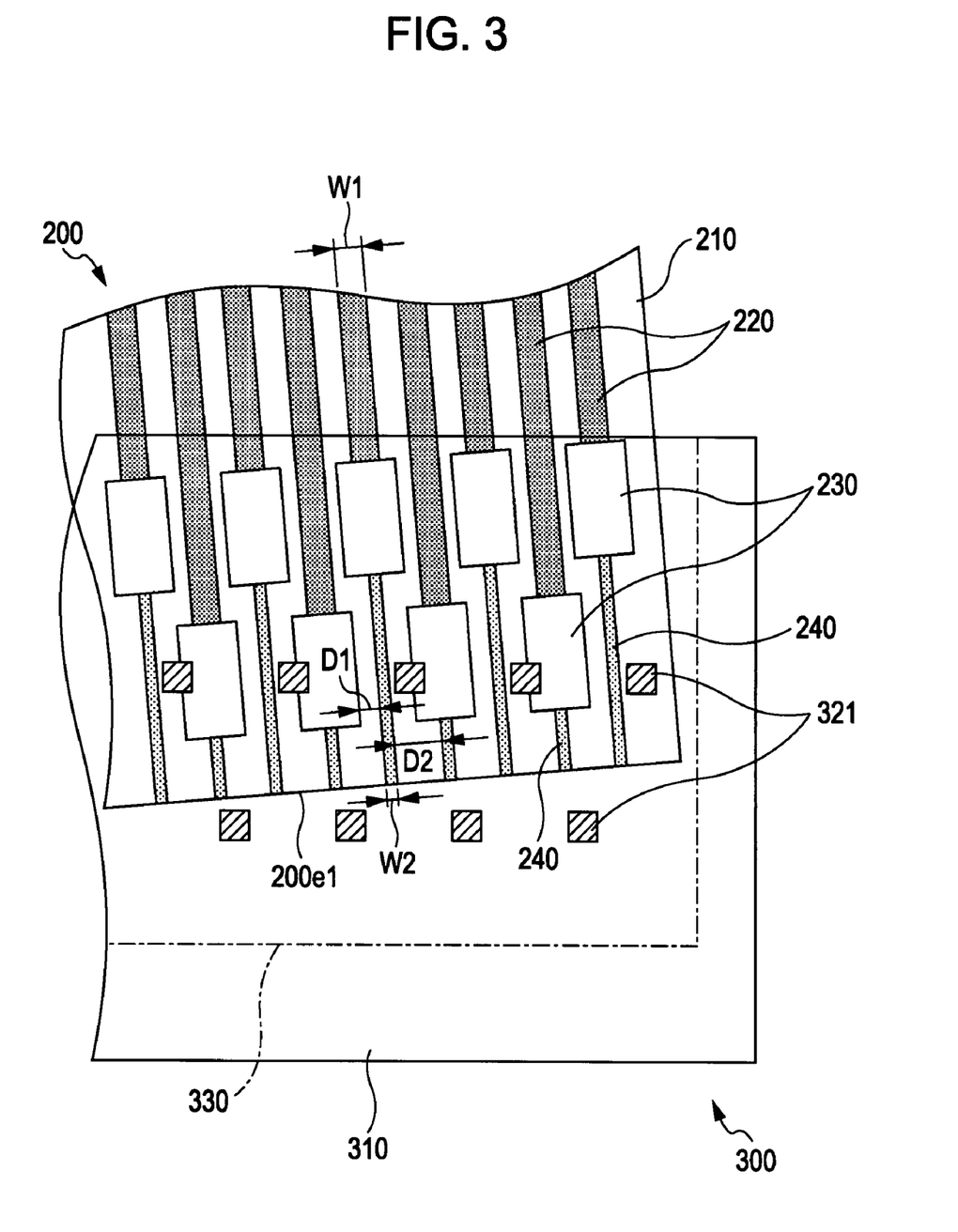
FIG. 3 illustrates a plan view of an exemplary flexible board in a state in which it is inserted at an angle into the connector.
Figure 4:
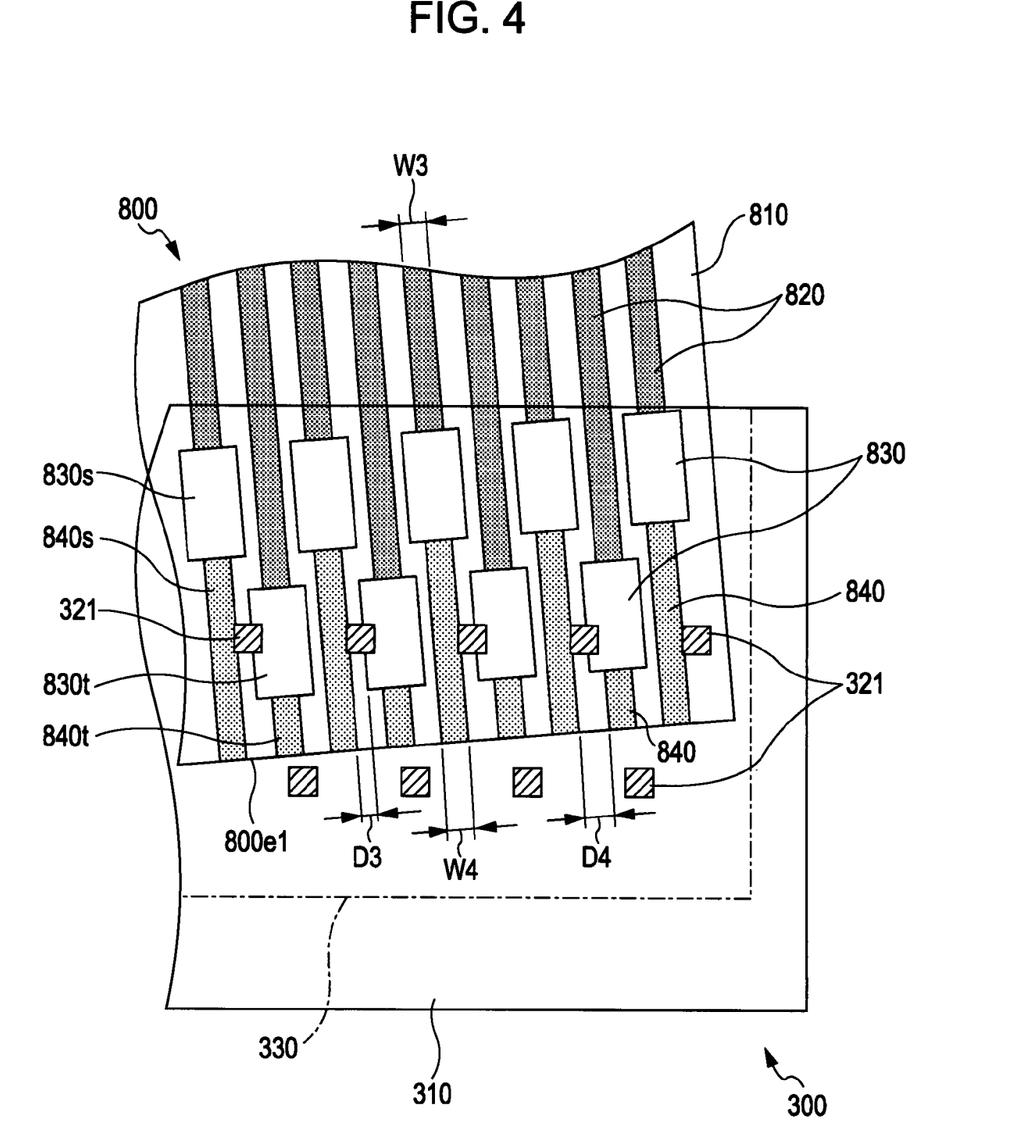
FIG. 4 illustrates a plan view of a comparative example in a state in which it is inserted at an angle into the connector

Referring now to FIGS. 3 and 4, and with continued reference to FIGS. 1 and 2, the plating lead wires 240 of the flexible board 200 will be specifically described in accordance with certain embodiments. FIG. 3 is a plan view of the flexible board 200 in a state in which it is inserted at an angle into the connector 300. FIG. 4 is a plan view of a comparative example in a similar state as shown in FIG. 3. FIGS. 3 and 4 are illustrative of the parts of the flexible board and the connector related to a potential short circuit created between adjacent terminals, and for simplicity sake, omit the other elements shown in FIG. 1.

As shown in FIGS. 1 and 3, the width W2 of each plating lead wire 240 may be set smaller than the width W1 of each wire 220. This can help reduce or help prevent a short circuit (electrical shorting) between adjacent terminals 230 that may occur when the flexible board 200 is inserted at an angle into the connector 300.

Turning to FIG. 4 as a comparative example, a flexible board 800 is configured such that a plurality of wires 820 and a plurality of plating lead wires 840 are disposed on a main body 810 in such a manner that the width W3 of each wire 820 and the width W4 of each plating lead wire 840 is substantially equal. If the flexible board 800 is inserted at an angle into the connector 300, then a short circuit may be formed between a first plating lead wire 840s which is connected to a first terminal 830s and a second terminal 830t which is adjacent to the first terminal 830s by the contact 321 of the connector 300. In other words, the contact 321 of the connector 300 may come into contact with both the first plating lead wire 840s and the second terminal 830t such that the first plating lead wire 840s and the second terminal 830t (that is, the adjacent terminals 830s and 830t) are electrically shorted. When a device connected to the flexible board 800 is activated with the adjacent terminals short-circuited, excessive current may flow into the device and interfere with normal operation or cause failure due to heat generation.

However, as depicted in FIGS. 1 and 3, in certain embodiments the width W2 of each plating lead wire 240 may be set at a width smaller than the width W1 of each wire 220. Accordingly, the distance D1 (see FIG. 3) between the plating lead wire 240 and the adjacent terminal 230 and the distance D2 (see FIG. 3) between adjacent plating lead wires 240 is larger than if plating lead wires 840 and the wires 820 are formed such that the width W4 of each plating lead wire 840 and the width W3 of each wire 820 are substantially equal (as illustrated in FIG. 4). In other words, with reference to FIGS. 3 and 4, the distance D1 between the plating lead wire 240 and the adjacent terminal 230 is larger than the distance D3 between the plating lead wire 840 and the adjacent terminal 830, and the distance D2 between adjacent plating lead wires 240 is larger than the distance D4 between adjacent plating lead wires 840. This can help in preventing the contacts 321 of the connector 300 from coming into contact with both the plating lead wires 240 and the terminals 230 when the flexible board 200 is inserted at an angle into the connector 300. Accordingly, this can help reduce or prevent the occurrence of an electrical short circuit between the adjacent terminals 230 and can help reduce or prevent abnormal operation or failure of a device to which the flexible board 200 is connected due to such electrical short circuit.

As described above, the use of the flexible board 200 can help reduce or prevent the occurrence of a short circuit between the adjacent terminals 230 as the width W2 of each plating lead wire 240 is smaller than the width W1 of each wire 220.

Figure 5:
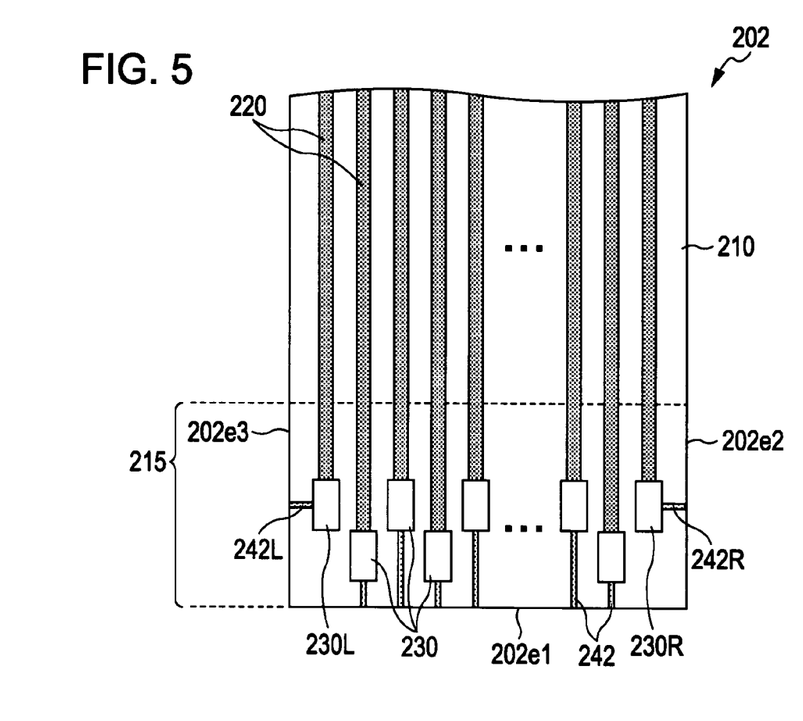
FIG. 5 illustrates a plan view of another exemplary flexible board in the same state as in FIG. 1.

Referring next to FIG. 5, a flexible board 202 will be described in accordance with additional embodiments. FIG. 5 is a plan view of the flexible board 202 in the same state as in FIG. 1. The connector 300 is omitted from FIG. 5 because it has a similar configuration as that shown in FIGS. 1-3. Components of FIG. 5 that are similar to those shown in FIGS. 1-3 will be identified by the same reference numbers, and descriptions thereof will be omitted as deemed appropriate.

As shown in FIG. 5, the flexible board 202 is different from the flexible board 200 illustrated in FIGS. 1-3 in that it has plating lead wires 242 in place of the plating lead wires 240. In other respects, it is substantially the same as the flexible board 200.

Plating lead wires 242R and 242L which are connected to terminals 230R and 230L, respectively, at the ends of the array of the terminals 230, may extend along the width of flexible board 202 (extending laterally as shown in FIG. 5). The plating lead wires 242R and 242L are an example of "end plating lead wires."

The plating lead wire 242R may extend from the terminal 230R along the width to an edge 202e2 of the flexible board 202. The plating lead wire 242L may extend from the terminal 230L along the width to a longitudinal edge 202e3 of the flexible board 202. Thus, the plating lead wires 242R and 242L do not extend to a lateral edge 202e1 at the end of the flexible board 202. This can help reduce or prevent the occurrence of a short circuit between the terminal 230R and the adjacent terminal 230 or between the terminal 230L and the adjacent terminal 230.

With the exception of the plating lead wires 242R and 242L, the other plating lead wires 242 may extend from the terminals 230 to the edge 202e1 at the end of the flexible board 202.

Figure 6:
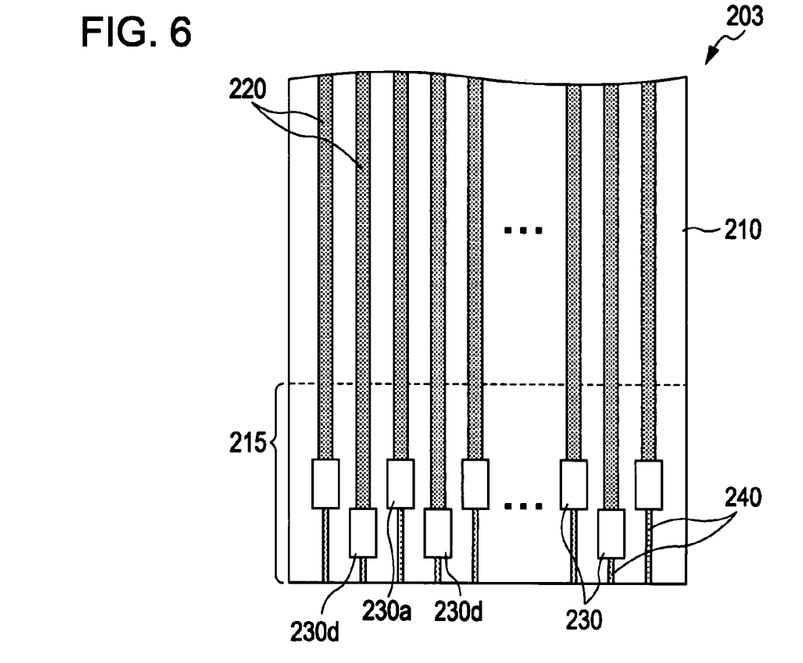
FIG. 6 illustrates a plan view of yet another exemplary flexible board in the same state as in FIG. 1.

Referring now to FIG. 6, a flexible board 203 will be described in accordance with other embodiments. FIG. 6 is a plan view of the flexible board 203 in a state substantially similar as that in FIG. 1. The connector 300 is omitted from FIG. 6 because it has a similar configuration as that illustrated in FIGS. 1-3. Components of FIG. 6 that are similar to those shown in FIGS. 1-3 are identified by the same reference numbers, and descriptions thereof will be omitted as deemed appropriate.

With continued reference to FIG. 6, the flexible board 203 may be configured such that power-source-side terminals 230d of the terminals 230 to which supply potential is applied are dummy terminals. That is, no electric signal is input to or output from the power-source-side terminals 230d. Thus, even if the flexible board 203 is inserted at an angle into the connector 300 and a short circuit created between the power-source terminals 230a and the power-source-side terminals 230d, potentially little or no ill effect, such as excess current or heat generation, will be exerted on any device connected to the flexible board 203.

Furthermore, in certain embodiments, the power-source-side terminals 230d may not be connected to the plating lead wires 240. This may help reduce or prevent a short circuit between the power-source terminals 230a and the power-source-side terminals 230d via the plating lead wires 240.

The power-source terminals 230a are supplied with supply potential and thus may be higher in potential than the other terminals to which other signals (for example, an image signal and various control signals) are applied. Consequently, if there is a short-circuit between the power-source terminals 230a and the other terminals 230, ill effects such as overcurrent may be exerted on a device connected to the flexible board 203. Accordingly, the use of the flexible board 203 in accordance with these embodiments can help improve the reliability of a device connected to the flexible board 203 by having the power-source-side terminals 230d, which are adjacent to the power-source terminals 230a to which supply potential is applied, formed as dummy terminals to which the plating lead wires 240 are not connected.

Figure 7:
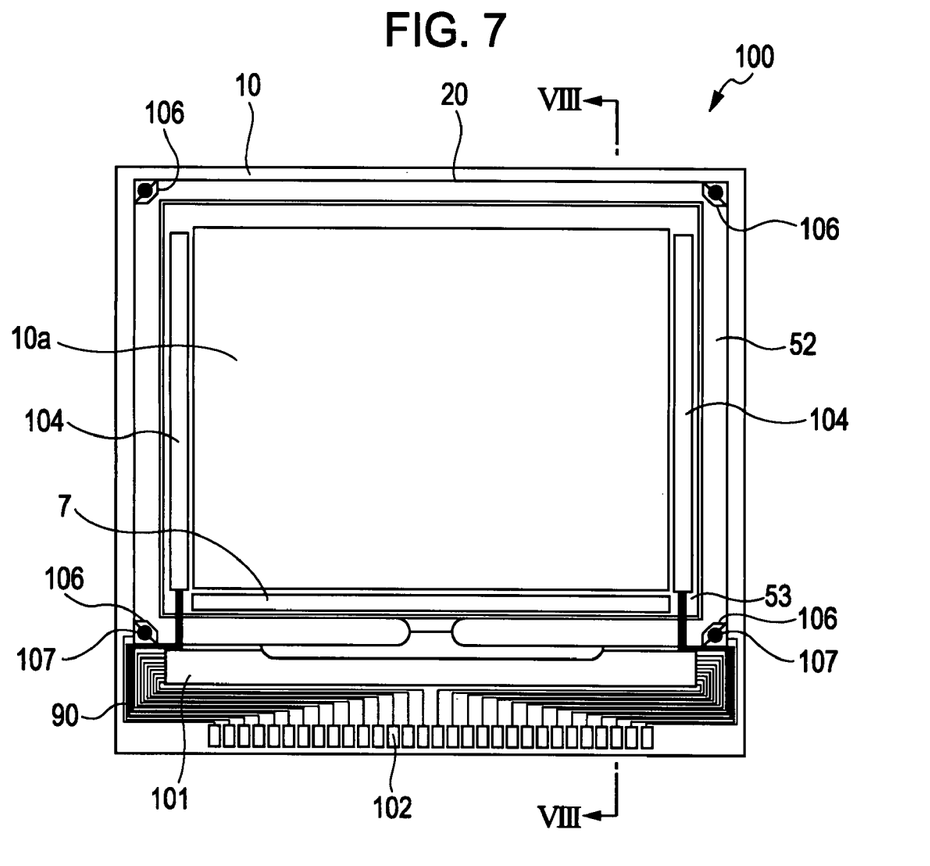
FIG. 7 illustrates a plan view of an exemplary liquid crystal device as an example of an electrooptic device.
Figure 8:
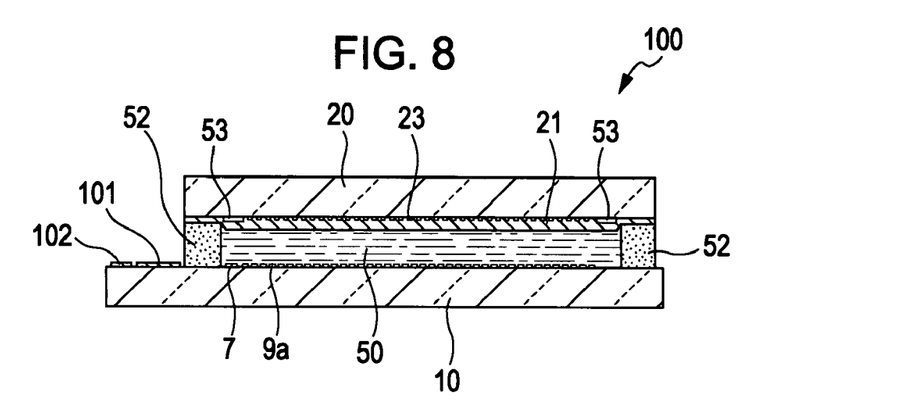
FIG. 8 illustrates a cross-sectional view taken along line VIII-VIII' of FIG. 7.
Figure 9:
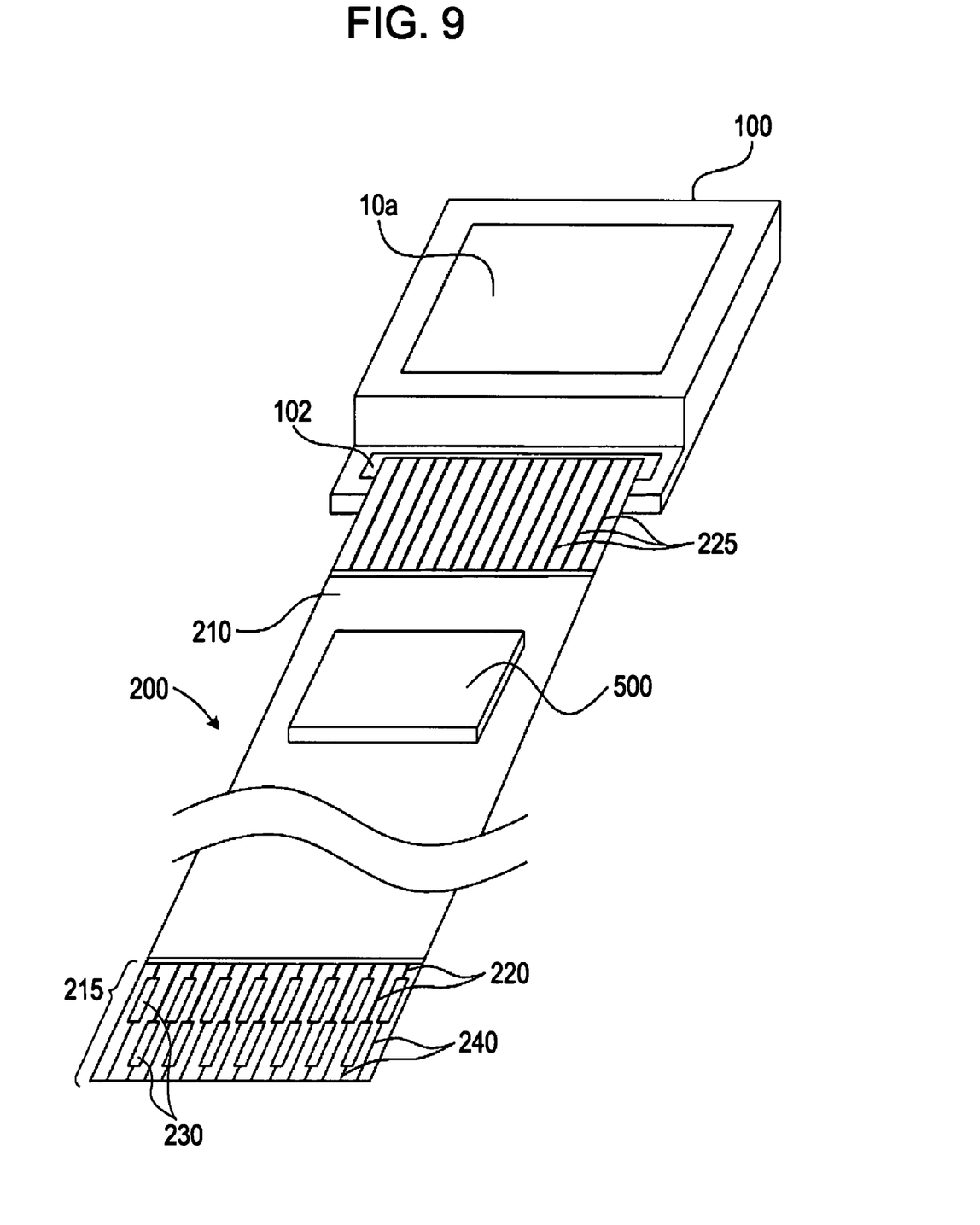
FIG. 9 illustrates a perspective view of an exemplary liquid crystal device with a flexible board as an example of an electrooptic device.

Referring now to FIGS. 7-9, a liquid crystal device with a flexible board will be described as an example of an electrooptic device in accordance with certain embodiments. In this example, a liquid crystal device 100 with the flexible board 200 of FIGS. 1-3 will be described.

Referring first to FIGS. 7 and 8, the overall structure of the liquid crystal device 100 will be described. FIG. 7 is a plan view of the liquid crystal device. FIG. 8 is a cross-sectional view taken along line VIII-VIII' of FIG. 7. FIGS. 7 and 8 depict the liquid crystal device 100 to which the flexible board 200 is not connected.

In FIGS. 7 and 8, the liquid crystal device 100 includes a TFT array substrate 10 and an opposing substrate 20. Between the TFT array substrate 10 and the opposing substrate 20 is sealed a liquid crystal layer 50. The TFT array substrate 10 and the opposing substrate 20 are bonded to each other with a sealing material 52 disposed in the sealing area around an image display area 10a.

Referring to FIG. 7, a frame light-shielding film 53 is disposed on the opposing substrate 20. The frame light-shielding film 53 defines the frame area of the image display area 10a inside in parallel to the sealing area in which the sealing material 52 is disposed. In the peripheral area, the area outside the sealing area in which the sealing material 52 is disposed has a data-line driving circuit 101 and external-circuit connection terminals 102 along one side of the TFT array substrate 10. A sampling circuit 7 is provided inside the sealing area along the one side in such a manner that it is covered with the frame light-shielding film 53. A scanning-line driving circuit 104 is provided inside the sealing area along two sides adjacent to the one side in such a manner that it is covered with the frame light-shielding film 53. Vertical conducting terminals 106 for connecting both the substrates with vertical conducting members 107 are disposed at the areas on the TFT array substrate 10 opposing the four corners of the opposing substrate 20. This allows electrical conduction between the TFT array substrate 10 and the opposing substrate 20.

The TFT array substrate 10 includes routing wires 90 for electrical connection among the external-circuit connection terminals 102, the data-line driving circuit 101, the scanning-line driving circuit 104, and the vertical conducting terminals 106.

Referring now to FIG. 8, the TFT array substrate 10 has a layer structure in which thin-film transistors (TFTs) for switching pixels, serving as driving elements, and wires of scanning lines, data lines and so on. The image display area 10a has pixel electrodes 9a in matrix form on the layer of the pixel-switching TFTs, the scanning lines, and the data lines. The pixel electrodes 9a have an alignment layer thereon. The opposing substrate 20 has a light-shielding layer 23 on the surface facing the TFT array substrate 10. The light-shielding layer 23 is made of, for example, light-shielding metal in a lattice pattern or the like in the image display area 10a on the opposing substrate 20. An opposing electrode 21 made of a transparent material such as indium tin oxide (ITO) is provided over the light-shielding layer 23 so as to be opposed to the pixel electrodes 9a. The opposing electrode 21 has an alignment layer thereon. The liquid crystal layer 50 is made of one kind nematic liquid crystal or a mixture of several kinds of nematic liquid crystal, and has a predetermined orientation between the pair of alignment layers.

Although not shown here, the TFT array substrate 10 may include an inspection circuit or an inspection pattern for inspecting the quality and defect of the liquid crystal device during manufacture or shipment in addition to the data-line driving circuit 101 and the scanning-line driving circuit 104.

Referring next to FIG. 9, the connection between the liquid crystal device and the flexible board will be described. FIG. 9 is a perspective view of the liquid crystal device with a flexible board, in a state in which it is connected to a flexible board. FIG. 9 shows only components directly related to the connection between the liquid crystal device and the flexible board, and omits other components that may be shown in FIGS. 1-3, 7, and 8.

With continued reference to FIG. 9, the flexible board 200 may be connected to the liquid crystal device 100 in such a manner that connecting portions 225 of the wires 220 opposite to the connector 300 (see FIG. 1) are connected to the external-circuit connection terminals 102. The connecting portions 225 of the flexible board 200 and the external-circuit connection terminals 102 may be connected together by thermocompression bonding using anisotropic conductive film (ACF). Specifically, ACF may be sandwiched between the connecting portions 225 and the external-circuit connection terminals 102. A heated head may then be pressed onto the thermocompression area of the connecting portions 225. Thus, the thermocompression area is heated with pressure such that the connecting portions 225 and the external-circuit connection terminals 102 are bonded together by the ACF and the connecting portions 225 and the external-circuit connection terminals 102 are electrically connected by the conductive particles in the ACF. The ACF may be comprised of conductive particles coated with insulating film and an adhesive. For example, the conductive particles may be fine particles of plastic coated with nickel. The adhesive may be thermoplastic resin or thermosetting resin, of which epoxy thermosetting resin is frequently used in view of reliability. A major characteristic of the ACF when thermocompressed is anisotropy, in which it exhibits conductivity in the vertical direction and an insulating property in the lateral direction.

The flexible board 200 may have a control circuit 500. The control circuit 500 may be connected to the wires 220 and is connected to at least part of the external-circuit connection terminals 102 via the connecting portions 225. The control circuit 500 may also be connected to the circuits built in the liquid crystal device 100, such as the data-line driving circuit 101 (see FIG. 7).

As described above, the flexible board 200 and the liquid crystal device 100 may be connected together by the thermocompression bonding of the external-circuit connection terminals 102 and the connecting portions 225 to constitute the liquid-crystal device 100 with the flexible board 200 as shown in FIG. 9. The use of the liquid crystal device 100 with the flexible board 200 can help reduce the occurrence of a short circuit between adjacent terminals 230 on the flexible board 200 and improve the reliability of the device.

Figure 10:
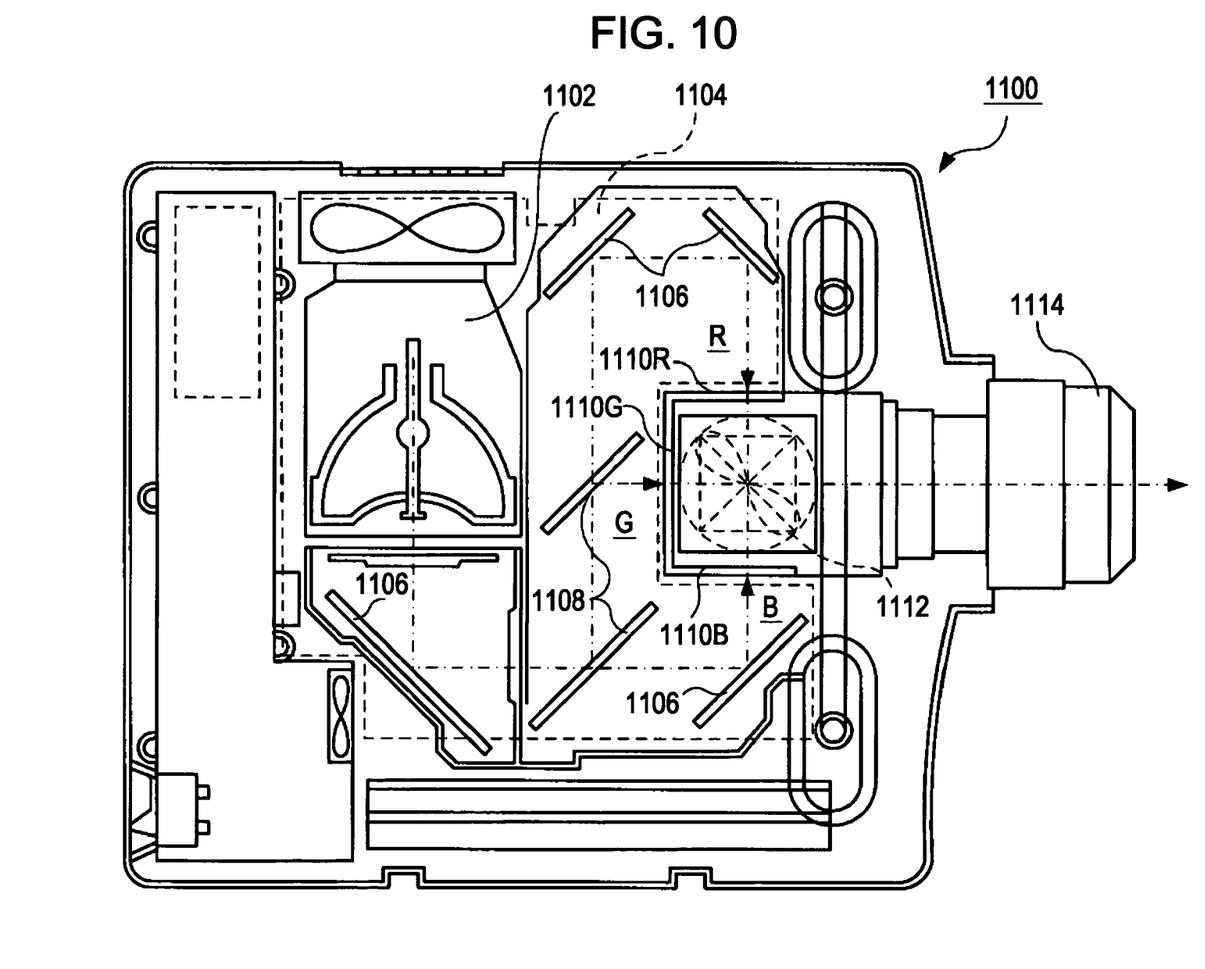
FIG. 10 illustrates a plan view of an exemplary projector as an example of an electronic device incorporating the electrooptic device.

Next, an exemplary projector that uses the liquid crystal device or the electrooptic device as a light valve will be described. FIG. 10 is a plan view of a projector 1100.

As shown in FIG. 10, the projector 1100 accommodates a lamp unit 1102 including a white light source such as a halogen lamp. The light emitted from the lamp unit 1102 is separated into the three primary colors of RGB by four mirrors 1106 and two dichroic mirrors 1108 disposed in a light guide 1104, and enters liquid crystal panels 1110R, 1110G, and 1110B serving as light valves corresponding to the respective primary colors.

The liquid crystal panels 1110R, 1110G, and 1110B have a similar structure as the above-described liquid crystal device, which are driven by primary-color signals of RGB applied from an image-signal processing circuit, respectively. The light modulated by the liquid crystal panels 1110R, 1110G, and 1110B enter the dichroic prism 1112 from three directions. The dichroic prism 1112 refracts R and B light at 90° and allows G light to go straight. The images of the colors are combined, and thus a color image is projected onto, for example, a screen, through a projection lens 1114.

Next, the display images by the liquid crystal panels 1110R, 1110G, and 1110B will be described. The display image by the liquid crystal panel 1110G will need to be reversed left to right with respect to the display images by the liquid crystal panels 1110R and 1110B.

The liquid crystal panels 1110R, 1110G, and 1110B do not need a color filter because corresponding RGB light enter the liquid crystal panels 1110R, 1110G, and 1110B through the dichroic mirrors 1108.

In addition to the exemplary electronic device described with reference to FIG. 10, electronic devices may include portable personal computers, portable phones, liquid-crystal televisions, viewfinder or monitor-direct-view type videotape recorders, car navigation systems, pagers, electronic notebooks, calculators, word processors, workstations, TV phones, POS terminals, and devices having a touch panel.

Other embodiments include a reflective liquid crystal device that has elements on silicon (LCOS), a plasma display (PDP), a field-emission display (FED), a surface-conduction electron-emitter display (SED), an organic EL display, a digital micromirror device (DMD), and an electrophoresis device.

It should be understood that the preceding is merely a description of several embodiments. While specific embodiments and applications have been illustrated and described, it is to be understood that the precise configuration and components disclosed herein is illustrative only and not limiting in any sense. Having the benefit of this disclosure, various modifications, changes, and variations will be apparent to those of ordinary skill in the art without departing from the spirit and scope of the principles disclosed. Thus, to the maximum extent allowed by law, the scope of the invention is to be determined by the broadest permissible interpretation of the following claims and their equivalents, and shall not be restricted or limited by the foregoing description.

What is claimed is:

1. A flexible board for making electrical contact with a connector, the flexible board having a length and a width and comprising:
    a plurality of wires disposed longitudinally along the length of the flexible board and each of the wires having a width;
    a plurality of terminals arranged laterally across the width of the flexible board near an end of the flexible board, the terminals being electrically connected to the wires; and
    a plurality of plating lead wires electrically connected to the terminals and extending longitudinally from the terminals toward a lateral edge of the flexible board, the plating lead wires each having a width, and the width of the plating lead wires being less than the width of the wires.

2. The flexible board according to claim 1, wherein at least a portion of the terminals are alternatingly displaced on the flexible board in a staggered manner.

3. The flexible board according to claim 1, wherein the width of the plating lead wires are appropriately configured such that even when the flexible board is inserted at an angle into the connector, an electrical short circuit does not occur between at least one of the plating lead wires and at least one of the terminals of the flexible board.

4. The flexible board according to claim 1, wherein the plating lead wires further comprise end plating lead wires, the end plating lead wires being electrically connected to the terminals and extending laterally from the terminals to the longitudinal edge of the flexible board.

5. The flexible board according to claim 1, wherein the plurality of terminals are displaced in a staggered manner and end plating lead wires are electrically connected to two of the terminals closest to the longitudinal edge of the flexible board, each end plating lead wire extending laterally from the terminal to the closest longitudinal edge of the flexible board.

6. The flexible board according to claim 1, wherein the plurality of terminals comprise power-source-side terminals and power-source terminals, the power-source-side terminals being configured as dummy terminals from which no electric signal is input or output.

7. The flexible board according to claim 6, wherein the power-source-side terminals are not electrically connected to the plating lead wires.

8. An electrooptic device including the flexible board according to claim 1.

9. An electronic device including the electrooptic device according to claim 8.

10. A flexible board for connecting to a connector having a plurality of connection terminals, the flexible board comprising:
   a main body extending along the length of the flexible board;
   a plurality of wires disposed on the main body and extending along the length of the main body;
   a plurality of terminals electrically connected to the wires at an end of the main body and arranged along the width of the main body so as to form an array and to correspond to a location of the plurality of connection terminals on the connector; and
   a plurality of plating lead wires electrically connected to an end of the plurality of terminals, the end being different from an end of the plurality of terminals that is connected to the plurality of wires, the plurality of plating lead wires extending to an edge of the flexible board, and each plating lead wire having a width smaller than the width of each of the wires.

11. The flexible board according to claim 10, wherein at least part of the plurality of terminals is arranged in a staggered manner.

12. The flexible board according to claim 10, further comprising end plating lead wires, the end plating lead wires being connected to the terminals at the ends of the array of the plurality of terminals and extending laterally along the width of the main body.

13. The flexible board according to claim 10, wherein the plurality of terminals further comprise power-source-side terminals and power-source terminals, the power-source-side terminals being adjacent to power-source terminals and being configured as dummy terminals from which no electric signal is input or output.

14. The flexible board according to claim 13, wherein the power-source-side terminals are not electrically connected to the plating lead wires.

15. An electrooptic device including the flexible board according to claim 10.

16. An electronic device including the electrooptic device according to claim 15.

* * * * *